United States Patent
Mariserla et al.

(10) Patent No.: US 9,097,388 B2
(45) Date of Patent: Aug. 4, 2015

(54) EFFLUENT MANAGEMENT, WASTE DILUTION, EFFLUENT PRE-DILUTION, ACID WASTE HANDLING

(75) Inventors: Sandeep Mariserla, Danbury, CT (US); Brian Kennedy Foster, Mountain View, CA (US); Aaron T. Francis, San Jose, CA (US); Gregory P. Lim, Fremont, CA (US); Jeffrey Chih-Hou Lowe, Cupertino, CA (US); Robert Anthony Sculac, Lake Oswego, OR (US)

(73) Assignee: Intermolecular, Inc., San Jose, CA (US)

( * ) Notice: Subject to any disclaimer, the term of this patent is extended or adjusted under 35 U.S.C. 154(b) by 585 days.

(21) Appl. No.: 13/548,722

(22) Filed: Jul. 13, 2012

(65) Prior Publication Data

US 2014/0014184 A1 Jan. 16, 2014

(51) Int. Cl.
*F16K 21/18* (2006.01)
*F17D 1/00* (2006.01)
*F17D 3/00* (2006.01)

(52) U.S. Cl.
CPC .. *F17D 1/00* (2013.01); *F17D 3/00* (2013.01); *Y10T 137/0318* (2015.04); *Y10T 137/8158* (2015.04)

(58) Field of Classification Search
CPC ......... F16N 27/00; B01J 8/001; B01J 8/0015; B01J 8/20; G05D 7/0605; G05D 9/02; G05D 11/138; G05D 11/133; G05D 11/132; B65G 53/66; C08F 2/00; B01F 15/00227; B01F 5/0408; F17D 3/00; F17D 1/00; H01L 21/76; Y10T 137/7287; Y10T 137/7313; Y10T 137/3018; Y10T 137/8158

USPC .................................................. 137/386, 395
See application file for complete search history.

(56) References Cited

U.S. PATENT DOCUMENTS

| | | | | |
|---|---|---|---|---|
| 5,370,269 A | * | 12/1994 | Bernosky et al. | 222/61 |
| 5,519,638 A | * | 5/1996 | Tiao | 137/386 |
| 5,632,960 A | * | 5/1997 | Ferri, Jr. et al. | 422/106 |
| 5,800,056 A | * | 9/1998 | Suzuki et al. | 366/152.4 |
| 6,021,806 A | * | 2/2000 | Lee | 137/393 |
| 6,112,947 A | * | 9/2000 | Hock | 137/395 |
| 6,572,255 B2 | * | 6/2003 | Husher | 366/132 |
| 6,845,298 B2 | * | 1/2005 | Nelson et al. | 366/141 |
| 8,545,636 B2 | * | 10/2013 | Miller et al. | 134/18 |
| 2002/0154567 A1 | * | 10/2002 | Husher | 366/132 |
| 2008/0134805 A1 | * | 6/2008 | Blasco et al. | 73/863.03 |
| 2012/0067920 A1 | * | 3/2012 | Veltrop et al. | 222/1 |
| 2013/0214000 A1 | * | 8/2013 | Stratton | 222/95 |
| 2014/0161714 A1 | * | 6/2014 | Wang et al. | 423/490 |

OTHER PUBLICATIONS

Nutrient Dosing Handbook; Pre-dilution of Acid/Base Concentrates; 2009; Argus Control Systems Limited; 2 pages.

* cited by examiner

*Primary Examiner* — Craig Schneider
*Assistant Examiner* — Craig J Price

(57) ABSTRACT

Multiple waste streams, including incompatible chemicals such as concentrated acids and/or strong base effluents, are handled together without the need for limiting or interrupting the processes run by the wafer processing tools. In some embodiments, waste tanks are primed with diluents, such as water, and a predetermined percentage of diluent is maintained in the waste tanks. In some embodiments, a diluent is flowed into the waste tanks concurrently with the waste pumping to generate a rinsing action for the waste tanks. Methods of the present disclosure accommodate both gravity type and vacuum type waste tanks.

6 Claims, 17 Drawing Sheets

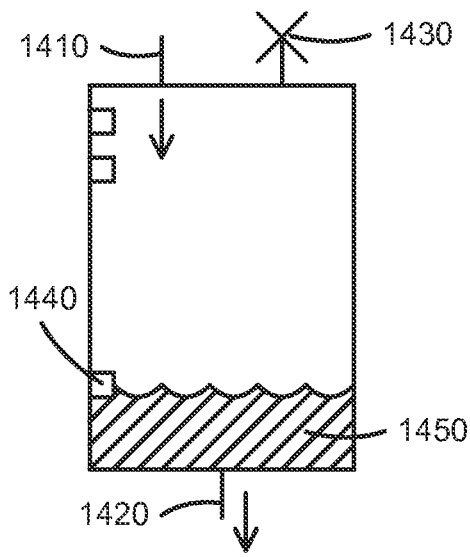
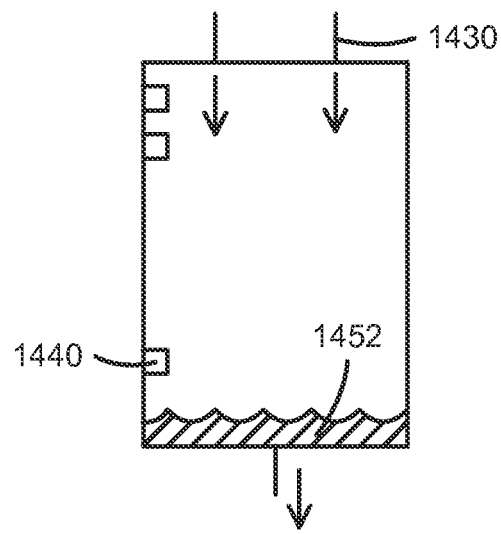
FIG. 14A    FIG. 14B
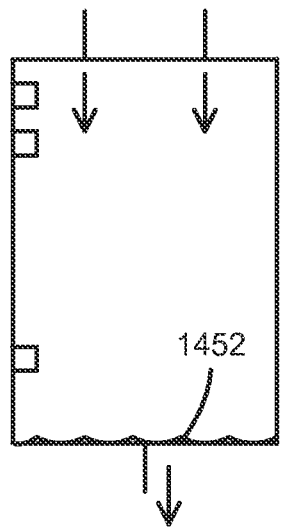
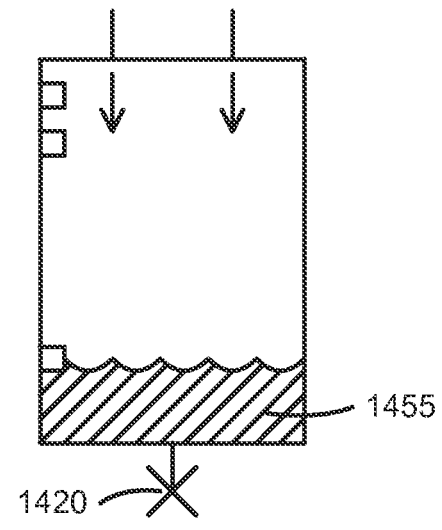
FIG. 14C    FIG. 14D

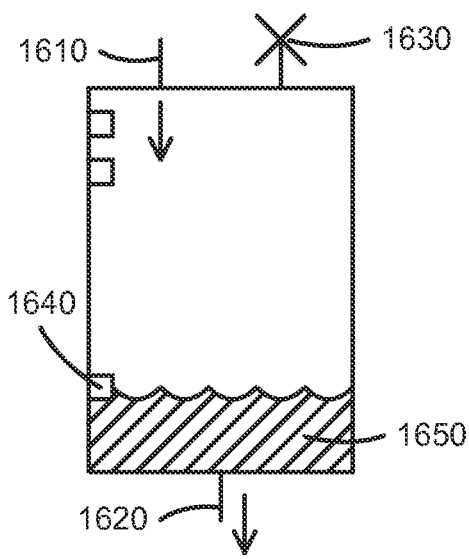
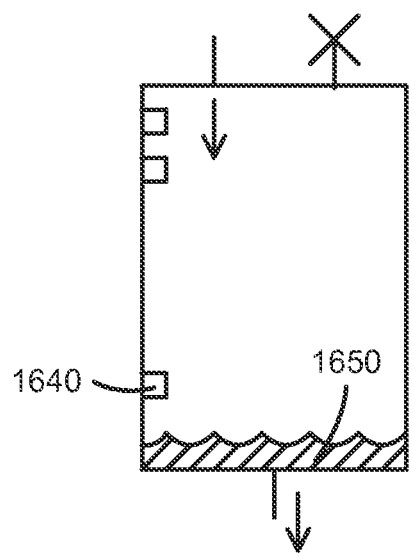
FIG. 16A  FIG. 16B
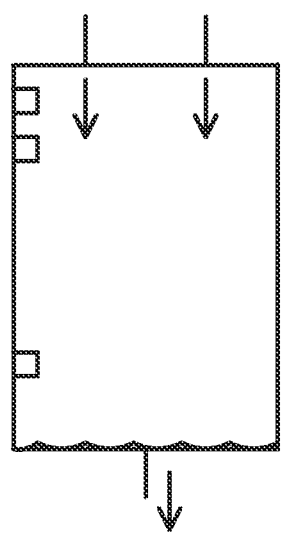
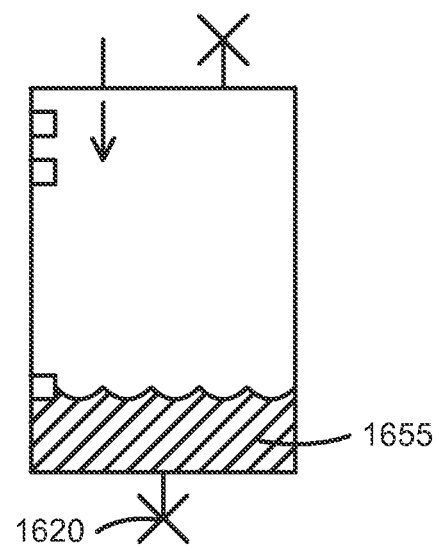
FIG. 16C  FIG. 16D

EFFLUENT MANAGEMENT, WASTE DILUTION, EFFLUENT PRE-DILUTION, ACID WASTE HANDLING

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps allows the formation of functional devices meeting desired performance metrics such as power efficiency, signal propagation, and reliability.

As part of the discovery, optimization and qualification of each unit process, it is desirable to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, chemical wastes at various concentrations and pH from multiple site isolated reactors are discharged into waste tanks. Safety hazard can exist, for example, if a waste tank is already filled with strong acids, discharging water into it could cause the temperature of the solution to rise above 100 C due an exothermic reaction between water and acid. In contrast, it is safer to introduce acid into water, since the acid will be diluted with a greater volume of water, providing a higher heat capacity, to absorb the heat of dilution. In addition, since some concentrated acids, such as 97% $H_2SO_4$, are viscous and dense, they could phase separate within the waste tank and become difficult to remove or pump out. Therefore there is a need for smart and effective waste effluent management for HPC chemistry development tools.

SUMMARY OF THE DESCRIPTION

Provided are systems and methods for waste effluent management for semiconductor processing equipment, such as an HPC chemistry development tool. These methods and systems can reduce various potential safety hazards associated with mixing of multiple waste streams of different chemical constituents, concentrations and pH levels, together with an effective removal of chemical wastes of different viscosity and density. In addition, the present invention can offer a continuous process flow without the need for limiting or interrupting the processes run by the semiconductor processing tools.

In some embodiments, the presented waste management method and system can reduce exothermic reactions in the waste tank, caused by the mixing sequence of two reactive chemicals. For example, it can be safe to introduce a first waste chemical to the waste tank containing a second waste chemical. However, the mixing of these same waste chemicals in reverse order can cause an exothermic reaction, during which the temperature of the waste tank rises rapidly and may exceed the temperature limits of the waste tank. As an illustrated example, an effluent of a strong acid can be safely discharged into a waste tank filled with water. However, when a water-based effluent is dumped into the waste tank containing a strong acid, such as the case of a water rinse following an acid etch process, water can react with the acid to generate heat, which can pose potential hazard for the waste tank management.

In some embodiments, the waste tank is pre-filled with water after being drained. In this case, there is always water in the tank. As such, when a strong acid effluent is drained into the waste tank, the temperature rise can be mitigated, for example, by distributing the same heat over a larger body of water, which has high heat capacity and thus resulting in a lower temperature increase. Further, when water effluent is drained to the waste tank, the existing acid in the waste tank is already diluted to reduce a further temperature rise.

In some embodiments, the presented waste management method and system can provide an effective removal of the waste chemicals, for example, to ensure that potential reactive chemicals are sufficiently removed from the waste tank. As an illustrated example, concentrated sulfuric acid, which is typically viscous and dense, tends to stay at the bottom of the waste tank and thus can be difficult to pump out. The presence of the remaining concentrated sulfuric acid can create a potential thermal hazard when a water effluent waste stream enters the waste tank, heating the waste tank to a temperature above the tolerable temperature.

In some embodiments, the presented waste management discloses methods and systems to enable continuous process flow while draining the waste tanks, especially with water priming the waste tank after every pump out.

In some embodiments, the present invention discloses a continuous process flow, including continuing running the process during the time of pumping the waste out. To prevent potential overflow of the waste tank, the waste pump can start before the waste tank reaches the full capacity level, thus allowing certain amount of additional process flow. A sensor can be used to signal the start of the waste pump, for example, when the waste chemicals reach about 90 or 95% of the full capacity of the waste tank.

In some embodiments, the present invention discloses a waste management system including signaling a full level of the waste tank that is less than the full capacity of the waste tank. The full level sensor can signal the waste pump to start draining the waste tank. Since the waste tank is still capable of receiving more waste, process drainage from the process chamber to the waste tank can still operate, allowing a continuous operation of the process flow even during the waste pumping process.

In some embodiments, the present invention discloses a continuous process flow, including process continuity even during the time of water flow to the waste tank for priming. The waste pump can be stopped, or continue pumping for a fraction of the time during the water priming step.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 14A-14D illustrate another process flow for a continuous process according to some embodiments of the present invention.

FIGS. 16A-16D illustrate another process flow for a continuous process according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for processing multiple waste streams from a processing tool, for example, to improve safety and enhance productivity. The present waste effluent management can reduce safety hazard, provide better waste removal, enable continuous process flow, and enhance system flexibility in handling process chemicals. In some embodiments, the present invention discloses methods and systems for use in high productivity combinatorial processes.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
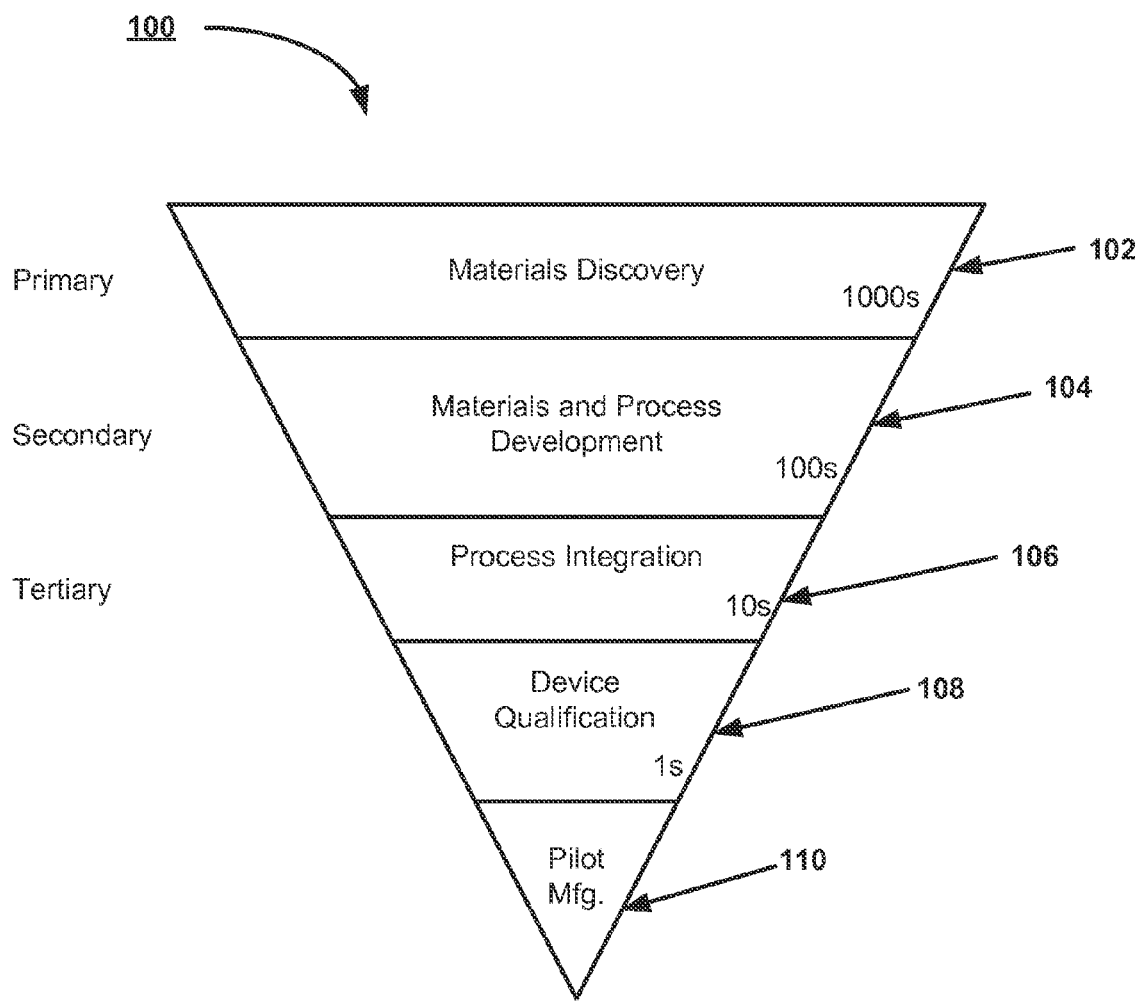
FIG. 1 illustrates a schematic diagram for implementing combinatorial processing and evaluating using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety for describing HPC methodology. Portions of the '137 application have been reproduced below to enhance the understanding. The embodiments described herein allow the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to allow valid statistical analysis of the test results within each region and across regions to be performed.

Figure 2:
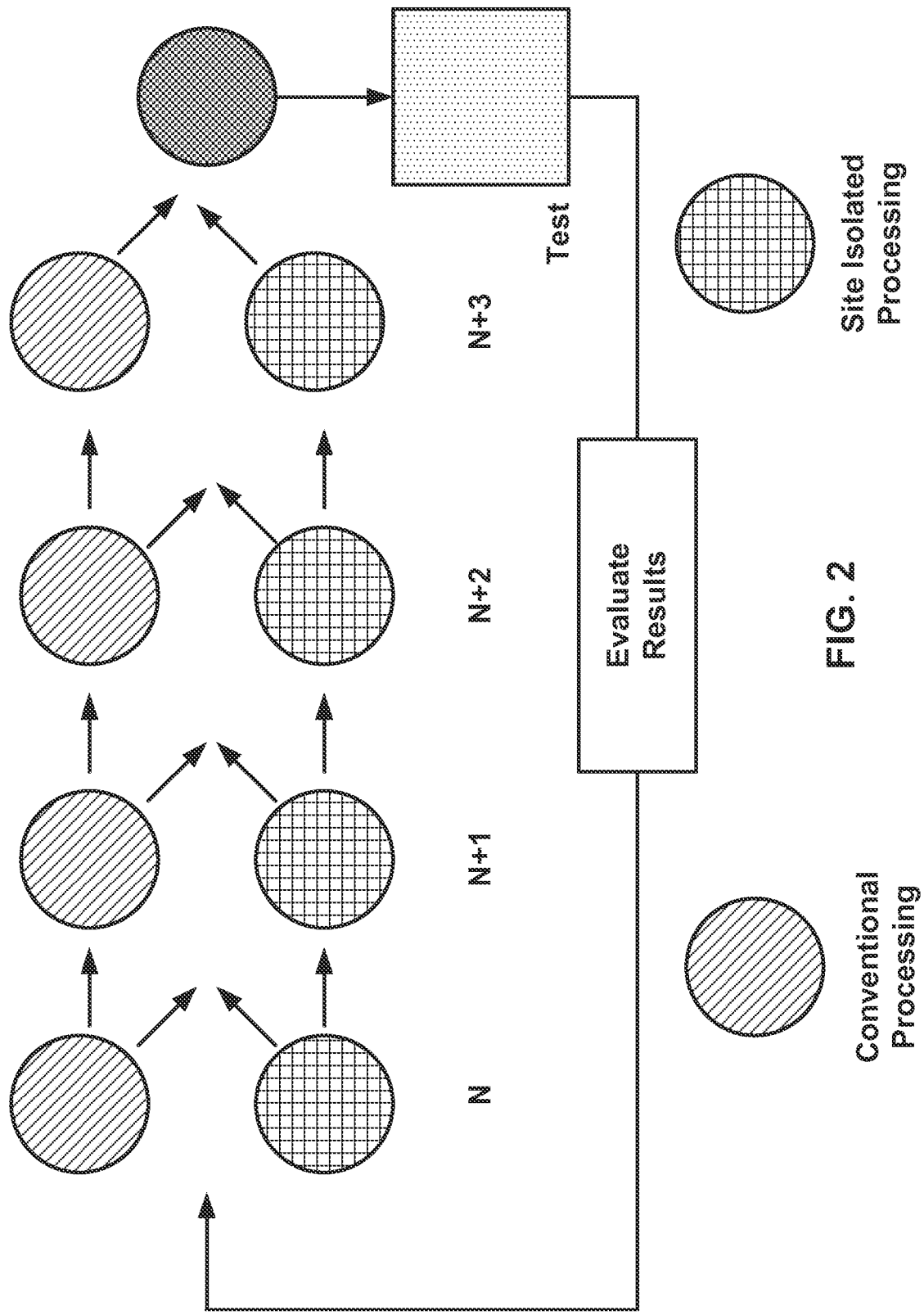
FIG. 2 is a simplified schematic diagram illustrating a general methodology for combinatorial process sequence integration that includes site isolated processing and/or conventional processing, in accordance with some embodiments.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are example and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
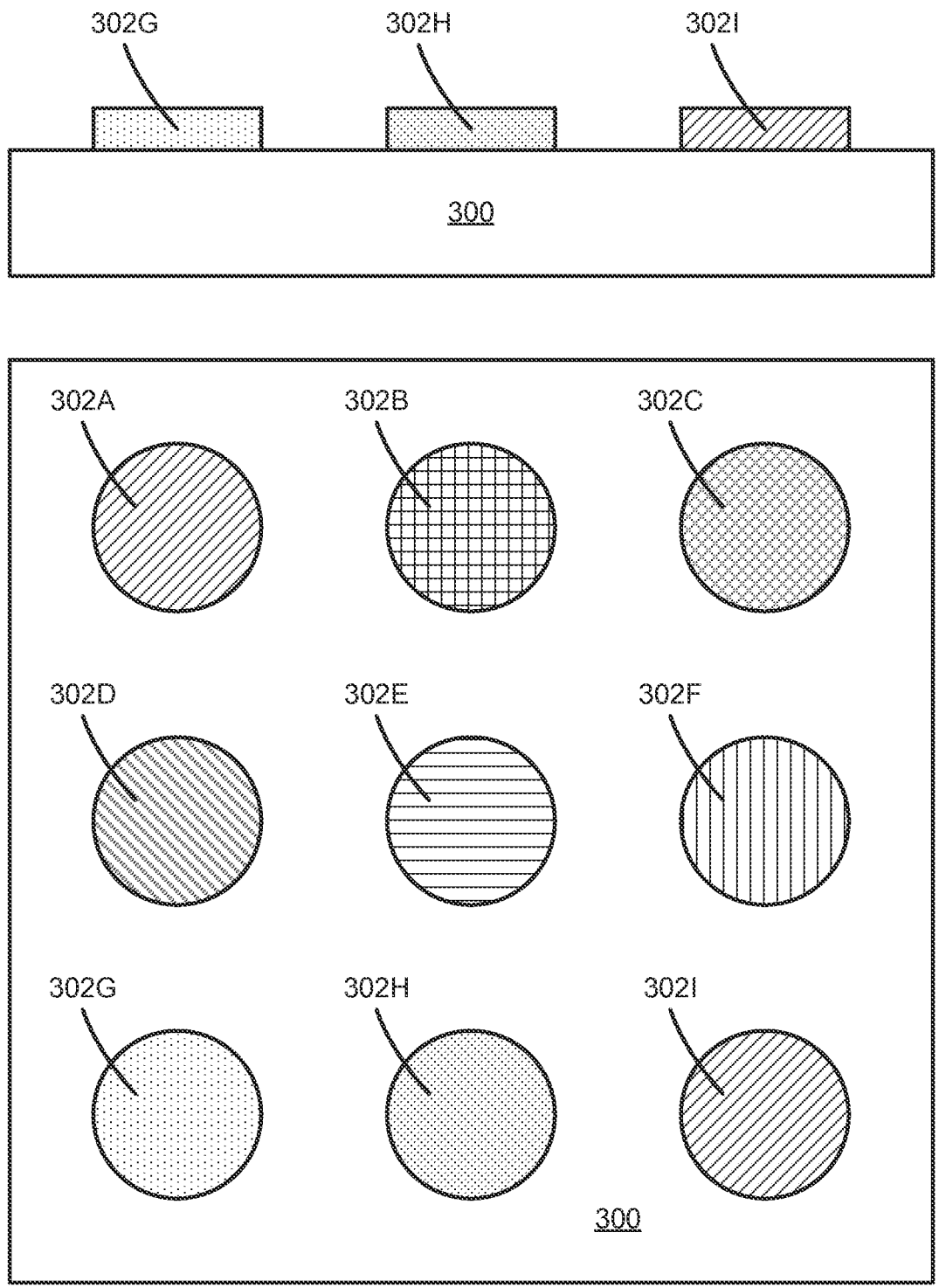
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302A-302I, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302G-302I. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
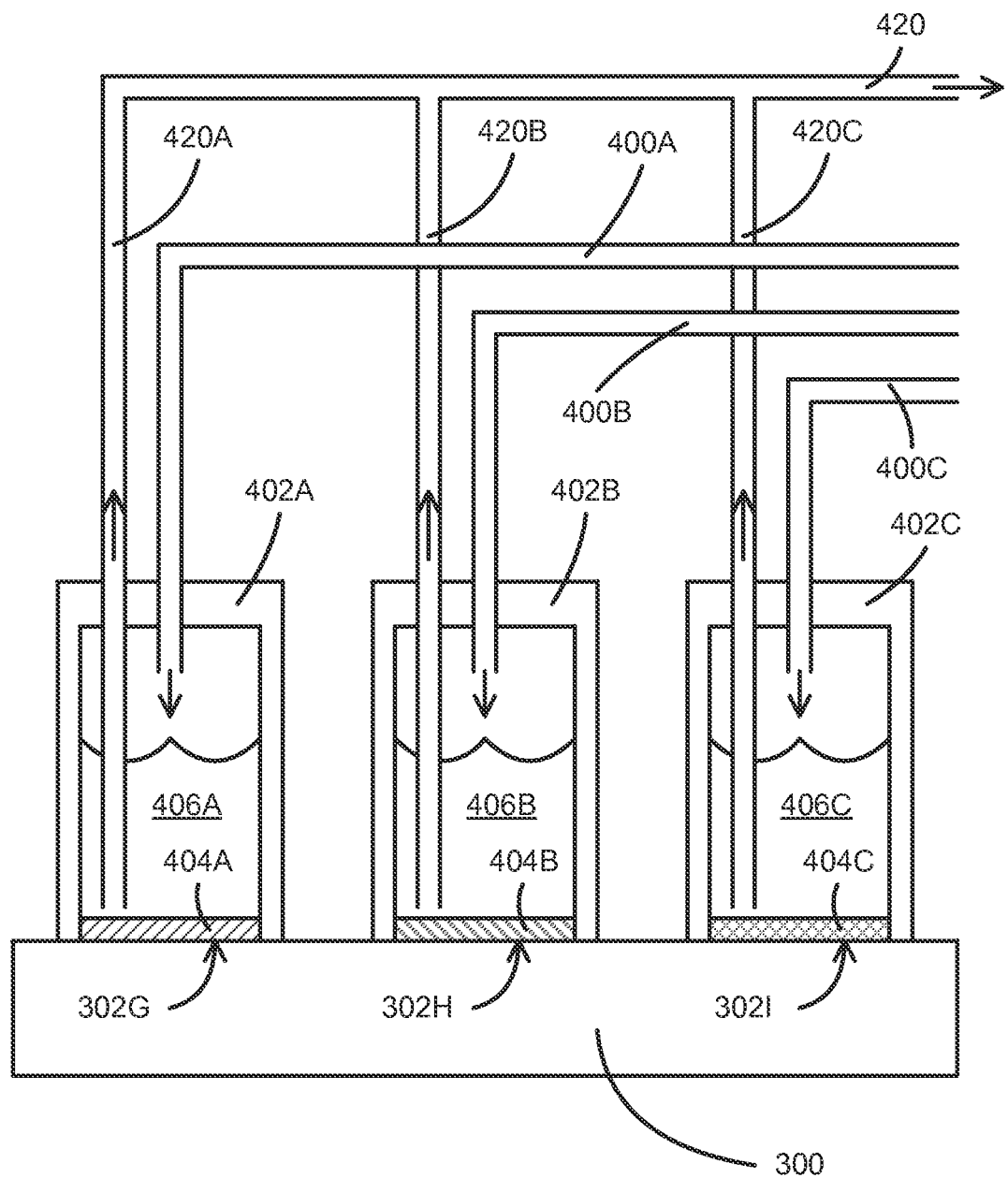
FIG. 4 illustrates a schematic diagram of a combinatorial wet processing system according to an embodiment described herein.

FIG. 4 illustrates a schematic diagram of a combinatorial wet processing system according to an embodiment described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302G-302I similar to the upper portion of FIG. 3. Solution dispensing nozzles, 400A-400C, supply different solution chemistries, 406A-406C, to chemical processing cells, 402A-402C. FIG. 4 illustrates the deposition of a layer, 404A-404C, on respective site isolated regions. Although FIG. 4 illustrates a deposition step, other solution-based processes such as cleaning, etching, surface treatment, surface functionalization, etc. may be investigated in a combinatorial manner. In some embodiments, the solution-based treatment can be customized for each of the site isolated regions.

Also shown in FIG. 4 are drainage lines 420A-420C, which are coupled to a common drainage 420 to be delivered to a waste tank. The drainage lines 420A-420C are vacuum drain lines, where the chemicals 406A-406C are aspirated to the waste tank. Other drain lines can be used, such as gravity drain lines, using gravity to drain the chemicals 406A-406C from the chemical processing cells 402A-402C.

In some embodiments, the present invention discloses systems and methods for waste effluent management that can have improved safety when handling potential reactive chemicals, such as concentrated acids and/or strong base effluents.

In some embodiments, the present waste management can reduce exothermic reactions in the waste tank, caused by mixing two reactive chemicals. For example, an effluent of a strong acid can be safely discharged into a waste tank containing water, or a water effluent can be safely introduced into a waste tank containing dilute acids. However, when water effluent is dumped into the waste tank containing a strong and concentrated acid, the temperature of the waste tank can rise rapidly to be above 100° C., which can pose a potential hazard.

In some embodiments, the present waste management can avoid such potential safety hazard by preparing a waste tank with dilute chemicals, such as dilute acids. The waste tank preferably contains dilute chemicals when accepting waste chemicals from the process flow, thus can minimize the exothermic reaction, for example, by mixing water effluent with concentrated acids in the waste tank. The diluents can be water, such as de-ionized water (DIW), or other solvent chemicals. In some embodiments, the present waste management prepares the waste tank with a certain amount of water after draining the waste tank before accepting any chemical waste. Possible hazard can be prevented, such as potential exothermic reactions caused by draining strong and concentrated acids (e.g., 98% $H_2SO_4$, concentrated HCl) into the waste tank first during an acid processing following by rinsing water.

The chemicals in the waste tank can be pre-diluted before running process to minimize exothermic reactions. The dilute chemicals can be above 30% dilution (i.e., 30% diluents such as water with 70% chemical), such as above 40% dilution, and more specifically at or above 50% dilution. The dilution can be calculated based on the ratio of chemicals and the water used, to minimize the chance of concentrated chemicals in the waste tank.

The waste tank can be primed, e.g., preparing for accepting waste chemicals, with water after being drained. Thus, water is always present in the waste tank and when strong acid effluent is drained into the waste tank, the exothermic reaction is mitigated, lowering the potential temperature rise of the waste tank. Afterward, when water effluent is drained to the waste tank, the existing acid in the waste tank has been diluted with the priming water, thus reducing further temperature rise.

In some embodiments, the present invention discloses a waste system including a diluents inlet for priming the waste tank after draining. The waste system can further include a prime-level sensor for determining the level of water priming. The sensor can be installed within the waste tank, signaling when the priming water has reached a desired level. The sensor can be coupled to the priming water flow, thus can automatically stop the water when the desired priming water level is reached.

Methods of the present disclosure accommodate both gravity type and vacuum type waste tanks. In gravity waste tanks, a large priming water can flow when the gravity tanks are pumped out. In vacuum waste tanks, the tanks are filled with priming water, preferably about 25% capacity, before vacuum is provided in the tanks. Multiple waste tanks can be installed with seamless toggling between the tanks.

Figure 5A:
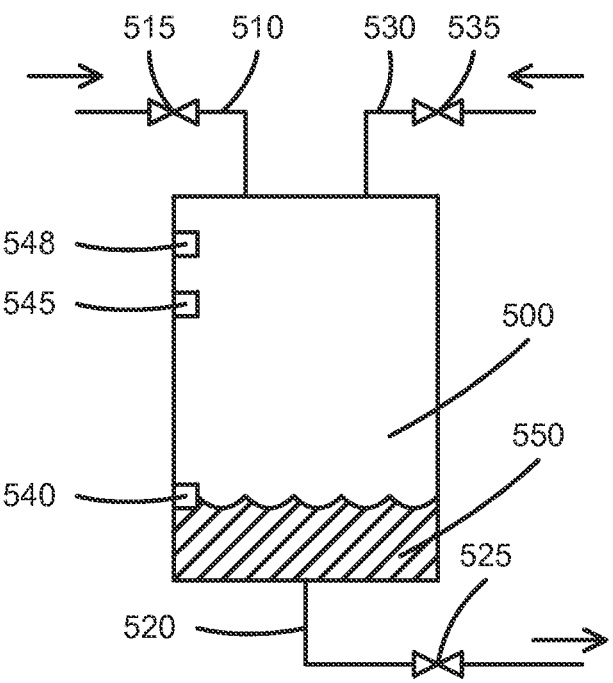
FIGS. 5A-5B illustrate exemplary waste process systems for gravity type and vacuum type waste tanks according to some embodiments.
Figure 5B:
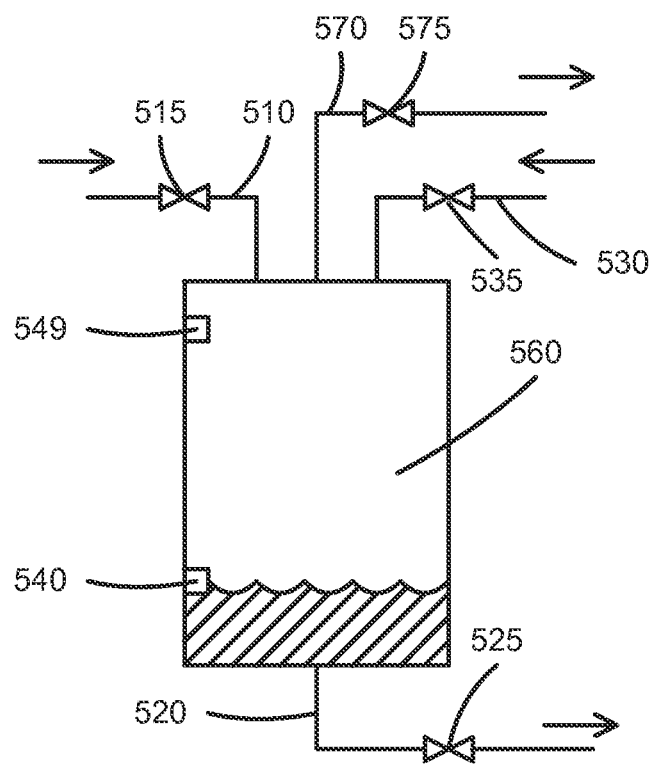

FIGS. 5A-5B illustrate example waste systems for gravity type and vacuum type waste tanks according to some embodiments FIG. 5A shows a gravity waste tank 500, including an inlet 510 for accepting process chemicals, together with a valve 515 to control the process chemical flow. The gravity waste tank 500 also includes a drainage outlet 520, coupled to a waste pump through a control valve 525. The gravity waste tank 500 also includes a priming water inlet 530 coupled to a control valve 535 for introducing priming water to the waste tank. A prime-level sensor 540 is installed in the waste tank 500 to indicate a prime volume 550 of the waste tank. For example, the prime-level sensor 540 can be coupled to control valve 535, thus can turn off the priming water inlet 530 when the water in the waste tank 500 reaches the predetermined volume.

The priming level can be between about 10 and about 50% capacity of the waste tank, preferably between about 20 and about 30%, and more preferably at about 25%. For example, for a waste tank having capacity of 5 L, the water priming can be about 1.5 L.

In some embodiments, the waste system further includes a waste fill-level sensor 545 for determining whether or not the waste tank is full. The sensor can be installed within the waste tank, signaling when the waste chemical has reached a desired level. The sensor can be coupled to the waste pump, thus can automatically start the waste pump when the waste tank is filled. The fill-level sensor can signal a waste level at between about 75% to about 95%, and preferably at between about 80% to about 90%.

In some embodiments, the waste system also includes an alarm-level sensor 548 for determining whether or not the waste tank is completely at capacity. Generally, the alarm-level sensor signals a waste level at about 100% capacity of the waste tank. The alarm-level sensor can also serve as a waste alarm sensor, stopping the process flow from draining chemicals to the waste tank.

FIG. 5B shows a vacuum waste tank 560, including an inlet 510 and valve 515 for accepting process chemicals, a drainage outlet 520 coupled to a waste pump through a control valve 525, and a priming water inlet 530 coupled to a control valve 535 for introducing priming water to the waste tank. A prime-level sensor 540 is installed in the waste tank 560 to indicate a prime volume of the waste tank. A vacuum outlet 570 coupled to a vacuum pump through a control valve 575 is included to generate a vacuum in the waste tank 560, allowing aspirating the chemical waste.

In some embodiments, the waste system further includes a waste full-level sensor 549 for determining whether or not the waste tank is full. The full-level sensor can signal a completely at capacity waste level, e.g., at about 100% level of the waste tank. Alternatively, waste fill-level sensor and alarm sensors can be included to separate between waste-fill level and at capacity level of the waste tank.

In some embodiments, the present invention discloses a waste effluent system which includes a waste tank; a first inlet coupled to the waste tank, wherein the first inlet is operable to deliver a waste effluent stream to the waste tank; an outlet coupled to the waste tank, wherein the outlet is operable to drain the waste tank; a second inlet coupled to the waste tank, wherein the second inlet is operable to deliver a diluents stream to the waste tank; and a first sensor coupled to the waste tank, wherein the first sensor is operable to indicate a fluid level in the waste tank.

In some embodiments, the waste effluent system further includes a vacuum pump, wherein the vacuum pump is operable to establish a sub-atmospheric ambient in the waste tank; a second sensor coupled to the waste tank, wherein the second sensor is operable to indicate that the waste tank is full, wherein the volume of the waste tank determined by the second sensor is less than the capacity of the waste tank; a third sensor coupled to the waste tank, wherein the third sensor is operable to indicate the capacity of the waste tank, or a controller, wherein the controller is coupled to at least one of the first inlet, the second inlet, the outlet, or the first sensor for automating a waste management sequence.

The present waste tanks can hence be able to handle multiple gallons of concentrated acid effluents. The temperature rise when multiple waste streams are discharged is reduced with the water priming process because acid is always added to water or water is only added to dilute acid. In some embodiments, the acid dilution is preferably greater or equal to about 50 vol % dilution, e.g., 1 part of acid in equal or more than 1 part of water.

In some embodiments, the present waste management can allow usage of very concentrated acids in chemical development tools. In addition, the present approach can help minimize any reliance on software for waste management safety. For example, the water required for dilution can be sourced from facilities, and its independence of tool functionality can enhance the safety feature of waste management.

The present waste management can allow greater flexibility in chemical and water flows, resulting in minimal constraints and flexible recipes for process development. For example, the constraint for water flow, such as restricting sequential water flow through the process after acid usage to minimize risk of uncontrolled exothermic reactions, can be relaxed, allowing ease of recipe development. Thus the present waste management process can greatly improve the freedom of process parameters that the tool was originally intended for.

The present waste management can also improve the choice of chemistries that can be used on the chemistry development tools without causing the temperature of the waste tank to increase to unsafe levels.

The present waste management can further prevent dangerous vapor buildup within the waste tanks thus reducing the risk of explosions and smoke. Further, the effluents discharged are considerably diluted, thus reducing the potential risk of corrosive vapor buildup and explosions in the facility waste disposal systems.

In some embodiments, after the waste tank is filled, the drainage starts, for example, by turning on the waste pump to pump out the content of the waste tank. The waste tank is then primed with diluents, such as water. The waste tank will automatically contain water for about 25% of the tank capacity as soon as the waste is pumped out.

Figure 6A:
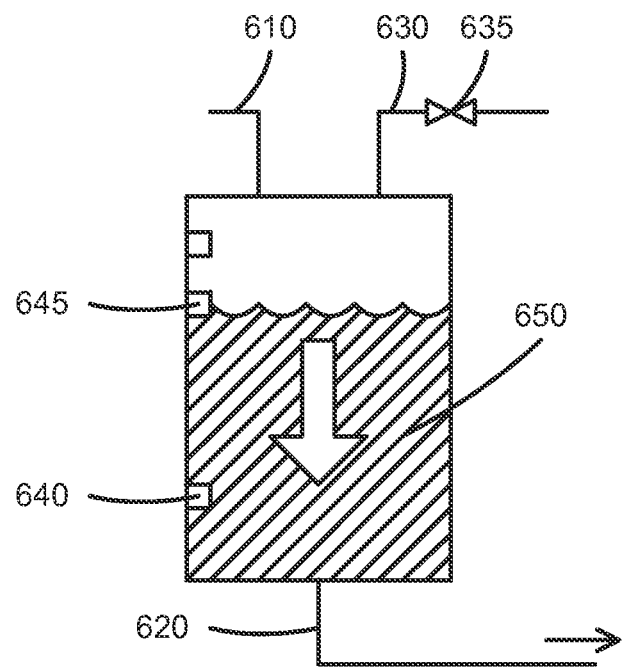
FIGS. 6A-6B illustrate a process flow for priming the waste tank according to some embodiments.
Figure 6B:
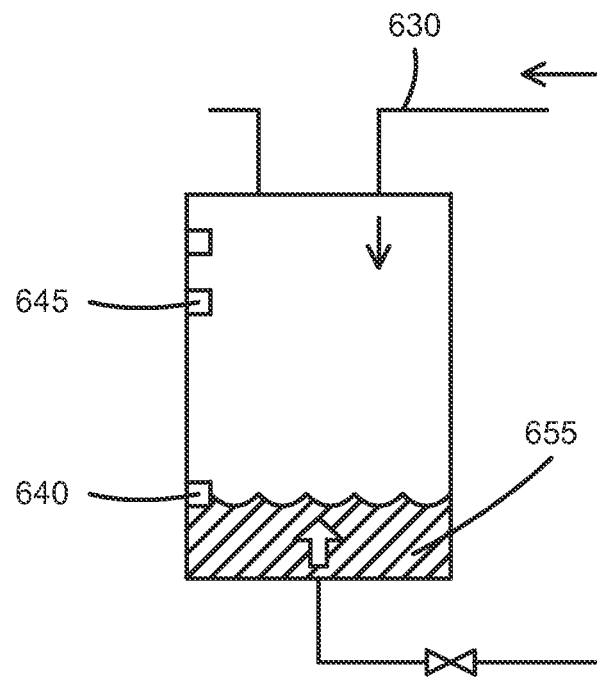

FIGS. 6A-6B illustrate a process flow for priming the waste tank according to some embodiments of the present invention. In FIG. 6A, process flow 610 dumps chemical waste 650 to the waste tank with the priming valve 635 closed to stop any priming water flow 630. After the waste 650 in the waste tank is full, indicated by a fill-level sensor 645, the waste pump line 620 starts, pumping the waste 650 from the waste tank. In FIG. 6B, after the waste pump completes the drainage, the priming water line is open to introduce water to the waste tank, preparing the waste tank to accept additional process chemicals. The priming water can flow until the priming water 655 reaches a priming level, for example, determined by the priming level sensor 640.

Variations of the above sequence can be included. For example, the process flow 610 can stop or still running during the pumping time of the waste pump or during the priming time of the priming water. The waste pump can completely drain the waste tank and then stop before starting the priming water. Alternatively, the waste can be completely drained, but the waste pump continues to run for a time during which the priming water flows to the waste tank. Alternatively, the priming water can start before or after finishing draining of the waste tank.

Figure 7A:
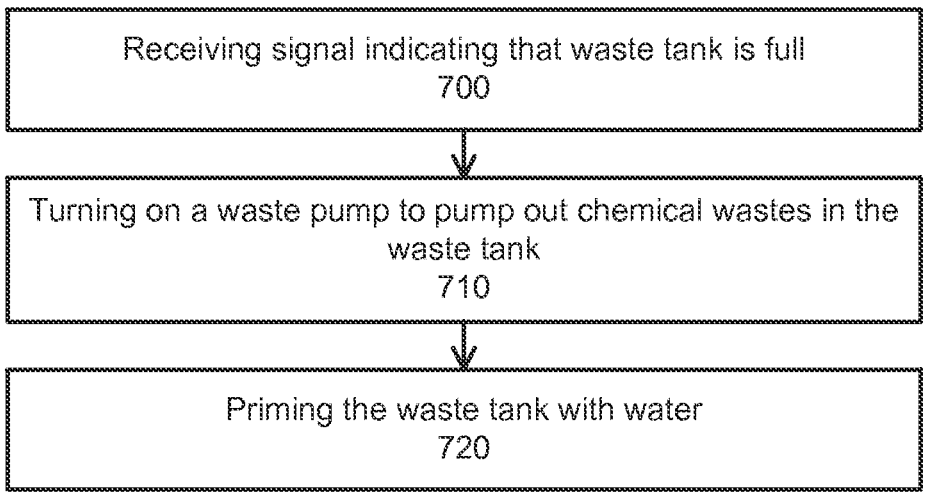
FIGS. 7A-7B illustrate flow charts for priming the waste tank according to some embodiments.
Figure 7B:
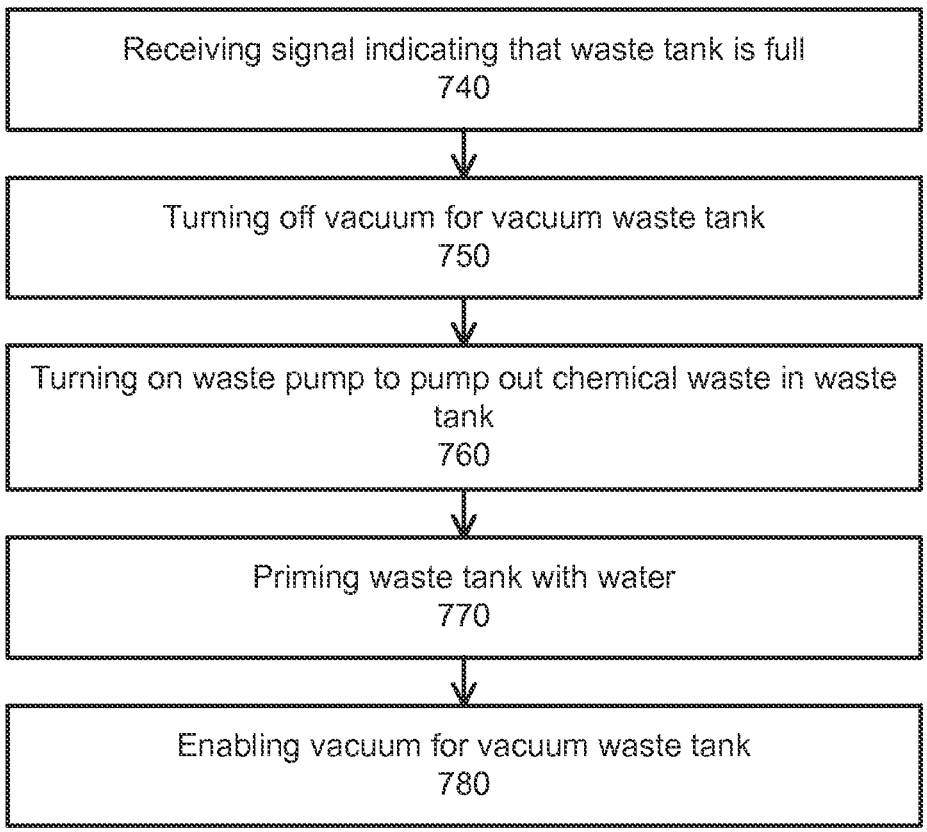

FIGS. 7A-7B illustrate flow charts for priming a waste tank according to some embodiments of the present invention. The flow charts describe examples of a liquid waste management, which include draining a waste tank, followed by a water priming process. FIG. 7A show a flow chart for priming a gravity waste tank. A waste tank can be provided, and liquid waste can be flowed to the waste tank from a process system. In operation 700, a signal is received indicating that the waste tank is full. The signal can be generated from a liquid level sensor, for example, the sensor is on when there is no liquid at the sensor level, and the sensor is off when the liquid is at or above the sensor level. The sensor can be installed to indicate a desired level of waste, and does not necessarily indicate a completely full level. For example, a waste full level sensor can be set at about 90 to 95% of the waste tank capacity. In some embodiments, the waste full level can be at least 60% or 80% of the waste tank capacity.

In operation 710, a waste pump is turned on to pump out the chemical wastes in the waste tank. A controller can be added to automate the process. For example, the waste full signal can be connected to the waste pump start signal, so that when the waste full sensor is on, the pump is automatically started. Alternatively, a microprocessor can be used, running a software program that receives signals from the waste full sensor and outputs signals to start the waste pump. In some embodiments, the waste tank is drained. The waste tank can be drained completely, meaning all liquid waste is removed from the waste tank. A portion of the solid waste in the waste tank can be removed during the drainage, and some portion of the solid waste can remain in the waste tank. The waste tank can be partially drained, leaving some liquid waste (and possibly some solid waste) within the waste tank.

In operation 720, the waste tank is supplied with a diluent such as water. The amount of water added to the waste tank can be used to prevent potential hazard of exothermic reactions of certain sequences of chemical dumping to the waste tank. The water can be added to the waste tank after or before the waste tank is completely empty, or can be added to the waste tank before or after the waste pump is turned off. Liquid waste can be continued to flow to the liquid tank. In some embodiments, the liquid waste can be continuously flowed during the draining of the waste tank.

FIG. 7B show a flow chart for priming a vacuum waste tank. Vacuum waste tank uses suction to aspirate chemical waste to the waste tank, thus requiring a vacuum ambient within the waste tank, which can be created by a vacuum pump. In general, the vacuum pump and the waste pump both are designed to remove materials from the waste tank, thus it is preferable to run in exclusive mode, e.g., the vacuum pump is turned off while enabling the waste pump. In operation 740, a signal is received indicating that the waste tank is full. In operation 750, the vacuum pump is turned off, preparing for the chemical waste to be pumped out. Since the vacuum pump is turned off, the vacuum waste tank is not operable, and thus one or more vacuum waste tanks are preferably connected in parallel to toggle the waste stream from the process reactor between waste tanks. In operation 760, a waste pump is turned on to pump out the chemical wastes in the waste tank. A controller can be added to automate the process, for example, coupling the waste full signal to the vacuum pump stop signal and the waste pump start signal. In operation 770, the waste tank is supplied with water. In operation 780, the vacuum pump is turned on to provide vacuum in the waste tank. A controller can be added to automate the process, for example, coupling the priming-level signal to the vacuum pump start signal.

In some embodiments, the present waste management can provide a rinsing operation of the waste chemicals to effectively remove the waste chemicals from the waste tank. In some embodiments, the rinsing action includes running the priming water while the waste pump is running. The concurrent action of waste pumping and water priming can help in rinsing the waste tank, especially at the bottom of the waste tank to remove the viscous and dense chemicals. The rinsing action can be time controlled, preferably at the end of the waste tank pumping.

In some embodiments, the present waste management discloses methods and systems to allow continuous process flow while the chemical waste in the waste tanks is removed, and while the waste tanks are prepared for accepting new waste. The present waste management can allow process flow during the waste drainage and during the water priming of the waste tanks.

For example, with single waste tank system, the process might need to stop when the waste tank is full. This interruption could disrupt process timing (e.g. rinse step can get delayed by about 45 seconds). In addition, the chemical flow to the process chamber would be limited to the capacity of the waste tank, such as about 4 L.

Further, the flow of priming water into the waste tanks could disrupt continuous processing on the tool, causing process delays, which in turn would requires significant software development, for example, increasing complexity for recipe development together with the challenge to capture, present and analyze actual data.

In some embodiments, the present invention discloses a waste management that can provide continuous processing. For example, priming water can flow into waste tanks concurrently to waste disposal during a tool process, e.g., allowing simultaneous water flow when process chemical is flowing to waste from process chamber. In some embodiments, the continuous processing on the tool can be achieved by enabling water partial pre-fill (e.g., priming, of the vacuum tanks before enabling vacuum, fast water flow immediately after gravity tank is pumped out, and simultaneous DIW flow when chemical is flowing to gravity.

In some embodiments, the present invention discloses a continuous process flow, including continuing running the process during the time of waste pumping out. To prevent potential overflow of the waste tank, the waste pump can start before the waste tank reaches the full capacity level, thus allowing certain amount of additional process flow. A sensor can be used to signal the start of the waste pump, for example, when the waste chemicals reach about 90 or 95% of the full capacity of the waste tank.

In some embodiments, the present invention discloses a waste management system including signaling a full level of the waste tank that is less than the full capacity of the waste tank. The full level sensor can signal the waste pump to start draining the waste tank. Since the waste tank is still capable of receiving more waste, process drainage from the process chamber to the waste tank can still operate, allowing a continuous operation of the process flow even during the waste pumping process.

In some embodiments, the pump out capacity will be higher than the process flow to ensure that the waste tank can be drained. For example, the pumping capacity can be about 9 Lpm while the process flow can be less than about 1.5 Lpm.

FIGS. 8A-8D illustrate a process flow for a continuous process according to some embodiments of the present invention. Using a waste-fill level sensor that signal a less than full capacity of the waste tank, waste overflow is possible, allowing process to continue at the transition time when the waste tank is switched on. The overflow capability can accommodate the possible time delay between the signal indicating that the waste tank is full and the signal to start the waste pump. The overflow capability can also accommodate a slow starting waste pump, by accepting additional waste during the start up time of the waste pump.

Figure 8A:
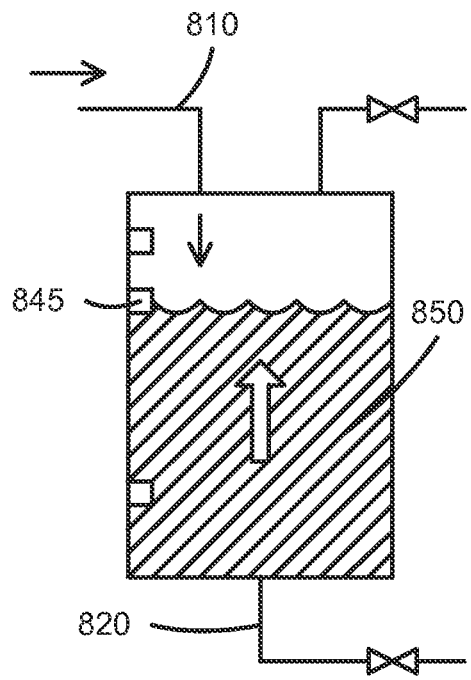
FIGS. 8A-8D illustrate a process flow for a continuous process according to some embodiments of the present invention.
Figure 8B:
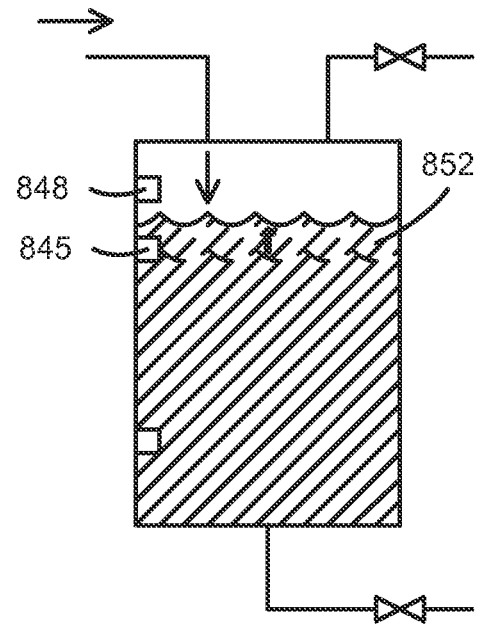

In FIG. 8A, a waste tank accepts a waste stream from a process inlet 810. The waste pump 820 is closed and the waste 850 is accumulated in the waste tank. When the waste 850 reaches the waste full level sensor 845, a signal is generated, indicating that the waste tank is full, and needed to be removed. In some cases, since the process continues to run, e.g., the waste stream continues to flow to the waste tank, waste overflow 852 can occur, filling the waste tank above the waste full level 845 (FIG. 8B). The waste overflow 852 can be accommodated in the waste tank, since the waste full level 845 is less than the capacity of the waste tank, indicated by the capacity sensor 848. The capacity sensor 848 can also act as an alarm sensor, which can shut off the process inlet 810 to prevent damage.

Figure 8C:
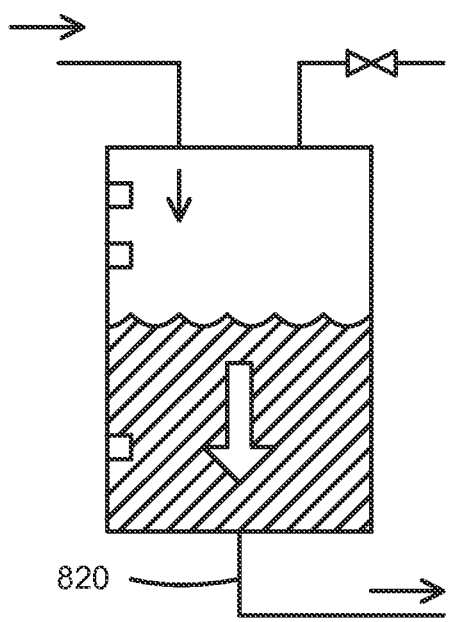
Figure 8D:
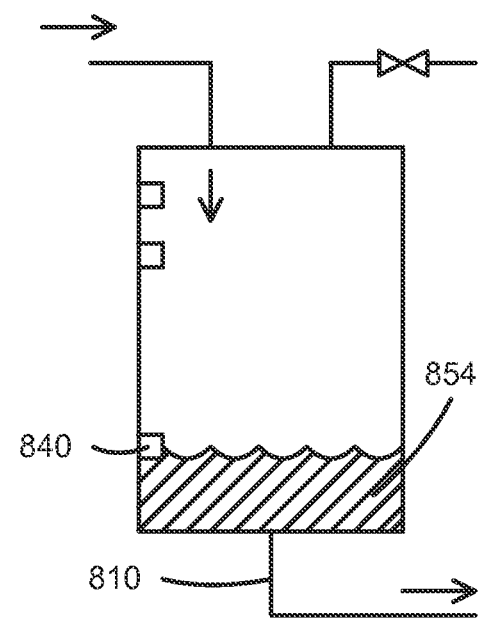

In FIG. 8C, the waste drain is running, draining the waste 850 in the waste tank. The pumping capacity of the waste pump is preferably much larger than the process flow, ensuring that the waste tank can be drained effectively. In some embodiments, a prime level sensor 840 can be used to indicate a volume of the waste 854 remaining in the waste tank (FIG. 8D). The prime level sensor 840 can be used to trigger a rinsing operation or an overflow timing for the waste pump.

Figure 9:
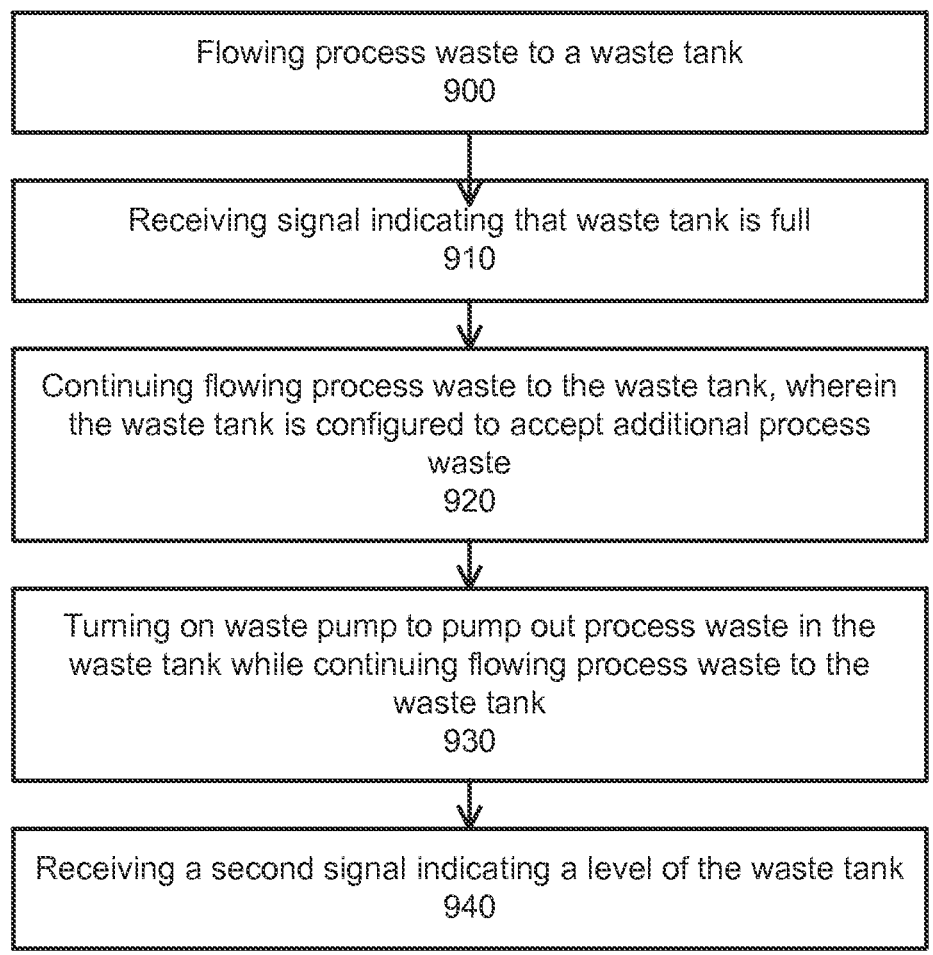
FIG. 9 illustrates a flow chart for enabling continuous processing according to some embodiments of the present invention.

FIG. 9 illustrates a flow chart for providing continuous processing according to some embodiments of the present invention. The flow chart describes an example of a liquid waste management, which allows a waste tank to operate, e.g., accepting waste flow from a process chamber, during the maintenance of the waste tank. In operation 900, process waste from processing cells is flowed to a waste tank. In operation 910, a first signal is received indicating that the waste tank is full. The sensor is installed to indicate a desired level of waste, and does not indicate a completely full level. For example, a waste full level sensor can be set at about 60 to 95% of the waste tank capacity, such as at about 70 to 95%, or at about 90% of the waste tank capacity. In operation 920, the process waste continues to flow to the waste tank, with the waste tank configured to accept additional waste, for example, by setting the waste-full level sensor below the 100% capacity. In operation 930, a waste pump is turned on to pump out the chemical wastes in the waste tank while the process waste continues to flow. A controller can be added to automate the process. For example, the waste full signal can be connected to the waste pump start signal, so that when the waste full sensor is on, the pump is automatically started. In optional operation 940, a second signal can be received, indicating a level of the waste tank. The second signal can be generated from the prime-level sensor, indicating a volume of the waste tank that can be used to prepare the waste tank with water.

In some embodiments, the conditions of the flow charts for priming a waste tank can be applied to the continuous process. For example, a waste full level sensor can be set at about 90 to 95% of the waste tank capacity. In some embodiments, the waste full level can be at least 60% or 80% of the waste tank capacity. The waste tank can be drained completely, meaning all liquid waste is removed from the waste tank. A portion of the solid waste in the waste tank can be removed during the drainage, and some portion of the solid waste can remain in the waste tank. The waste tank can be partially drained, leaving some liquid waste (and possibly some solid waste) within the waste tank.

For vacuum waste system, it might be difficult to run the waste pump concurrently while accepting the process flow, since the vacuum level in the waste tank might be affected by the waste pump. Multiple vacuum waste tanks can be used with seamless toggling between the waste tanks can then allow continuous processing.

Figure 10A:
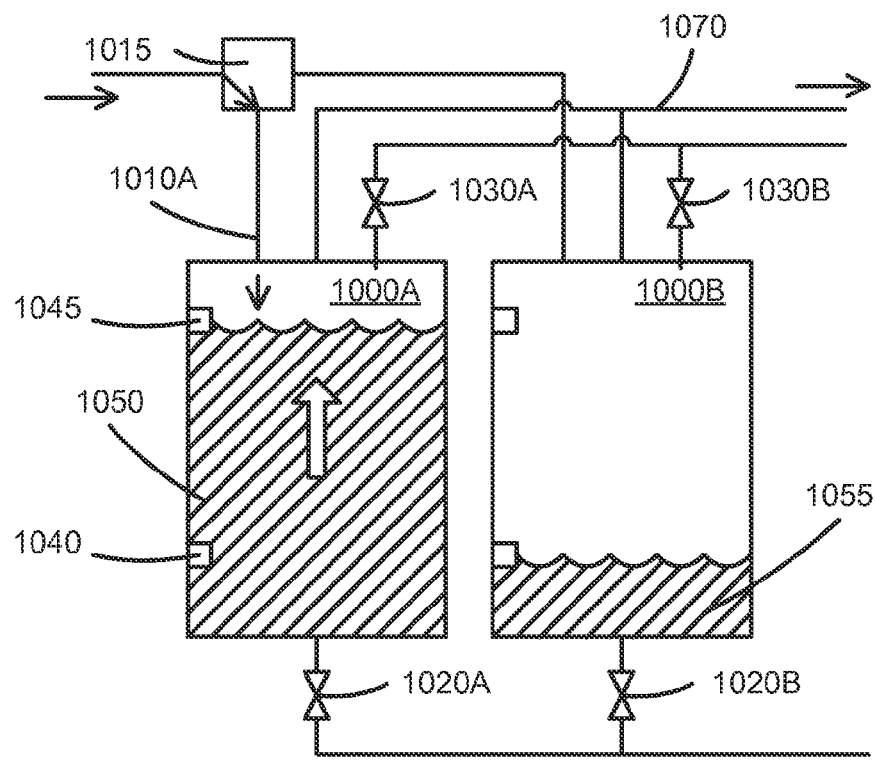
FIGS. 10A-10B illustrate another process flow for a continuous process according to some embodiments of the present invention.
Figure 10B:
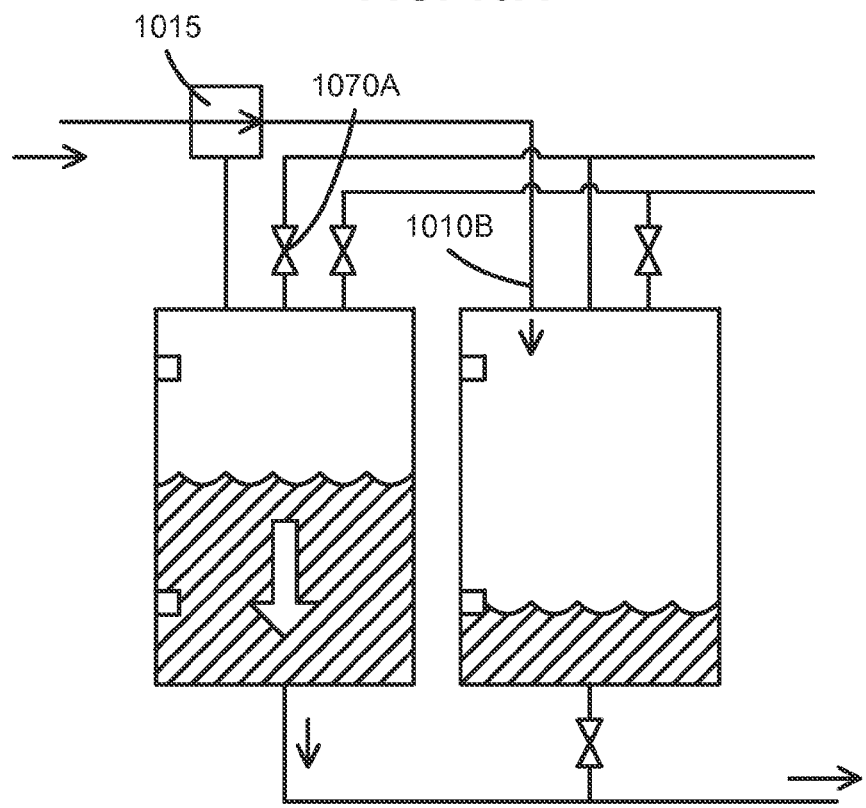

FIGS. 10A-10B illustrate another process flow for a continuous process according to some embodiments of the present invention. In FIG. 10A, a first waste tank 1000A accepts a waste stream from a process inlet 1010A, directed from toggle switch 1015. The waste pump 1020A is closed, the vacuum pump 1070 is provided, the priming water 1030A is closed, and the waste 1050 is accumulated in the waste tank. A second waste tank 1000B is in standby, having water 1055 at the prime-level 1040. The waste pump 1020B is closed, the vacuum pump 1070 is enabled, and the priming water 1030B is closed in the second waste tank 1000B. When the waste 1050 reaches the waste full level sensor 1045, a signal is generated, indicating that the waste tank is full, and needed to be removed.

In FIG. 10B, the toggle switch 1015 directs the process flow 1010B to the second waste tank 1000B so that the process can continue to run without interruption. At the waste tank 1000A, the vacuum pump 1070A is closed, and waste pump 1020A starts running, draining the waste 1050 in the waste tank 1000A.

Figure 11:
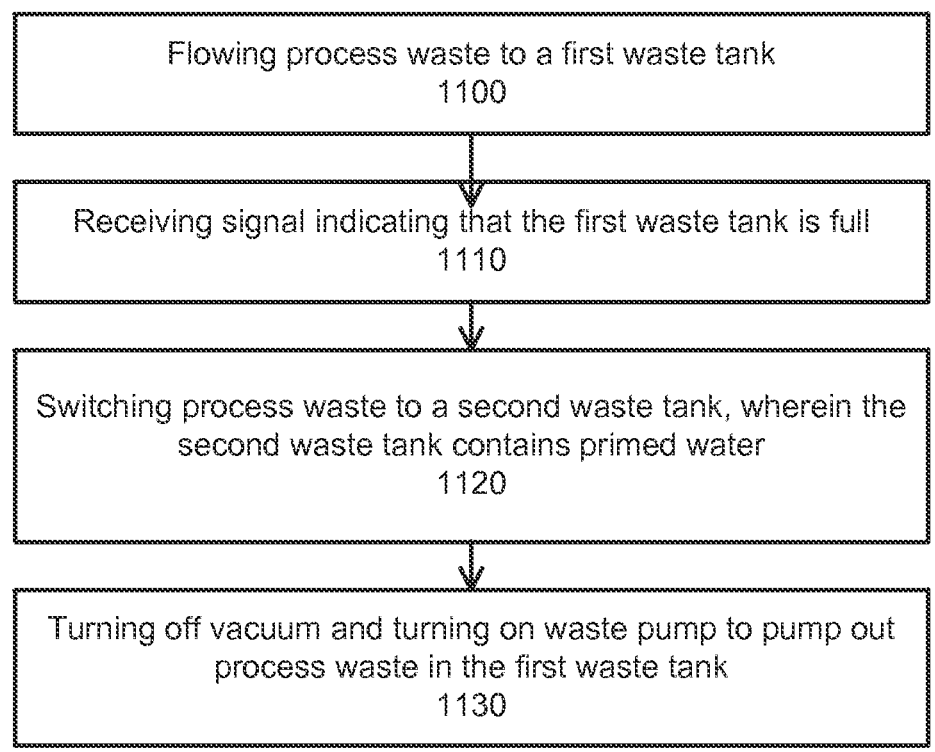
FIG. 11 illustrates another flow chart for enabling continuous processing according to some embodiments of the present invention.

FIG. 11 illustrates another flow chart for providing continuous processing according to some embodiments of the present invention. The flow chart describes an example of a liquid waste management, which allows a waste tank to operate, e.g., accepting waste flow from a process chamber, during the maintenance of the waste tank. In operation 1100, process waste from processing cells is flowed to a first waste tank. In operation 1110, a first signal is received indicating that the first waste tank is full. In operation 1120, the process waste is switched to a second waste tank, with the second waste tank configured to have a certain amount of water. In operation 1130, the vacuum pump for the first waste tank is turned off, and the waste pump for the first waste tank is turned on to pump out the chemical wastes in the waste tank while the process waste flows to the second waste tank. A controller can be added to automate the process. For example, the waste full signal can be connected to the toggle switch, the vacuum pump signals and the waste pump signals, so that when the operation sequence can be automatically started. After the first waste tank is drained, water can be added to the first waste tank to the prime level. The vacuum pump can start, and the first waste tank is ready for accepting a waste stream, for example, when the second waste tank is full.

In some embodiments, the conditions of the flow charts for priming a waste tank can be applied to the continuous process. For example, a waste full level sensor can be set at about 90 to 95% of the waste tank capacity. In some embodiments, the waste full level can be at least 60% or 80% of the waste tank capacity. The waste tank can be drained completely, meaning all liquid waste is removed from the waste tank. A portion of the solid waste in the waste tank can be removed during the drainage, and some portion of the solid waste can remain in the waste tank. The waste tank can be partially drained, leaving some liquid waste (and possibly some solid waste) within the waste tank.

In some embodiments, the present invention discloses a continuous process flow, including continuing running the process during the time of adding water to the waste tank for priming. By reducing or eliminating trace amount of potential reactive chemicals remaining in the waste tanks after a waste pump out, the potential hazard related to water added to the waste tanks for priming can be significantly reduced. For example, the waste tank can be over-drained, e.g., running the waste pump longer than necessary to ensure that the waste tank is completely drained. Alternatively, the waste pump can be running for a period of time during the water priming to reduce potential reactions between the priming water and remaining chemicals in the waste tank.

In some embodiments, after the waste tank is empty, the waste pump stops, and water is added to the waste tank to prime the waste tank. The process continues to run during this time. To reduce potential heat up of the waste tank, for example, by adding water to concentrated acid that might be present in the waste tank, additional actions can be performed. For example, the flow of the water can be higher than the process flow to prevent building up excess chemicals at the waste tank during the water flow. The water flow can be about twice the process flow, for example, about 3 Lpm while the process flow is less than about 1.5 Lpm.

In addition, complete waste drainage can be performed to prevent water, during the priming action, from reacting with remaining acids in the waste tank, such as water adding to trace amount of possibly dangerous chemical in the waste tank. For example, sensor can be used to ensure that the waste is completely drained. Alternatively, the waste tank can be over-pumped, e.g., running longer than the rated capacity of the waste tank, to ensure a complete drainage of the waste tank. For example, pumping can continue for about 10 seconds after complete drainage, e.g., when low sensor turns off.

FIGS. 12A-12D illustrate another process flow for a continuous process according to some embodiments of the present invention. Using the prime level sensor 1240 that signal the volume of water to be added to the waste tank after a pump out, the waste volume 1250 of the waste tank can be determined.

Figure 12A:
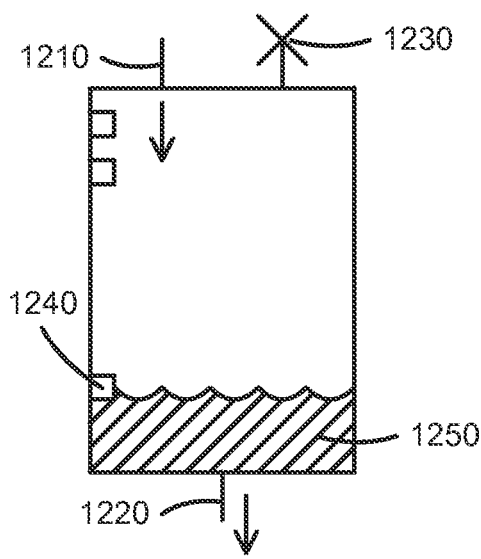
FIGS. 12A-12D illustrate another process flow for a continuous process according to some embodiments of the present invention.
Figure 12B:
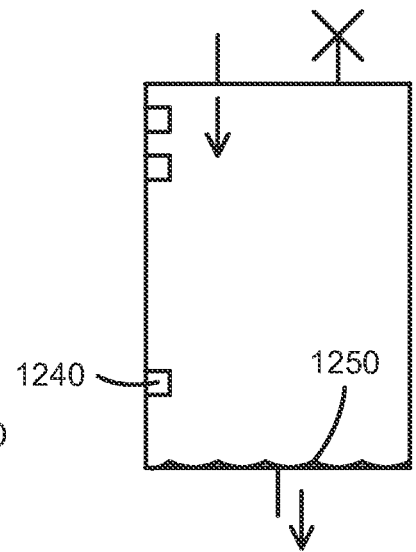

In FIG. 12A, the waste 1250 reaches the prime level sensor 1240 after the waste pump 1220 drains the waste tank from the waste fill level. The process flow 1210 continues to run, continuously delivering the waste stream to the waste tank. The water inlet 1230 is closed. After the signal from the sensor 1240, the waste pump can continue running for a period of time to completely drain the remaining waste 1250. The time is preferably calculated to ensure a complete drainage, for example, by providing over-pumping time. For example, if the remaining volume (e.g., determined from the prime-level sensor 1240) is 1.5 L, the maximum process flow 1210 is 1.5 Lpm, and the waste pump capacity is 9 Lpm, about 12 seconds is needed to evacuate the waste 1250. Over-pumping time is desired, and the pumping time is longer than about 12 seconds, preferably longer than about 30 seconds, and most preferably about 40 seconds. However, there might be some residue of the waste 1250 remaining in the waste tank (FIG. 12B).

Figure 12C:
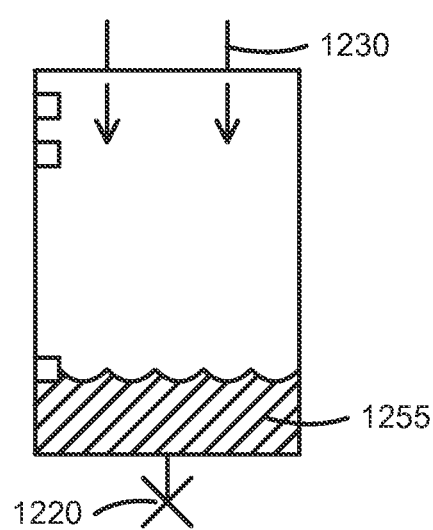
Figure 12D:
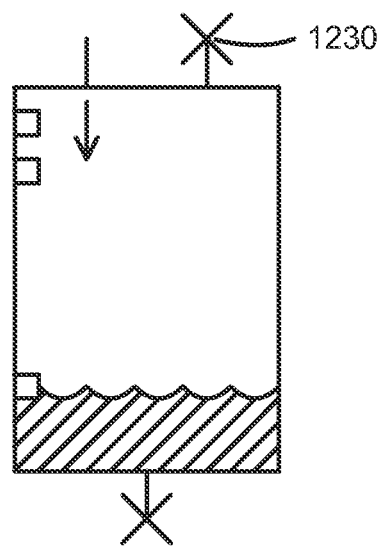

In FIG. 12C, high volume water flow from water inlet 1230 is provided to the waste tank while the waste pump 1220 is turned off. The high water flow can quickly dilute any remaining residues in the waste tank, forming a large volume of water to accept the added waste from the process flow. For example, the water flow can be about 3 Lpm. After the water reaches the prime-level sensor 1240, the water inlet 1230 is turned off (FIG. 12D).

Figure 13:
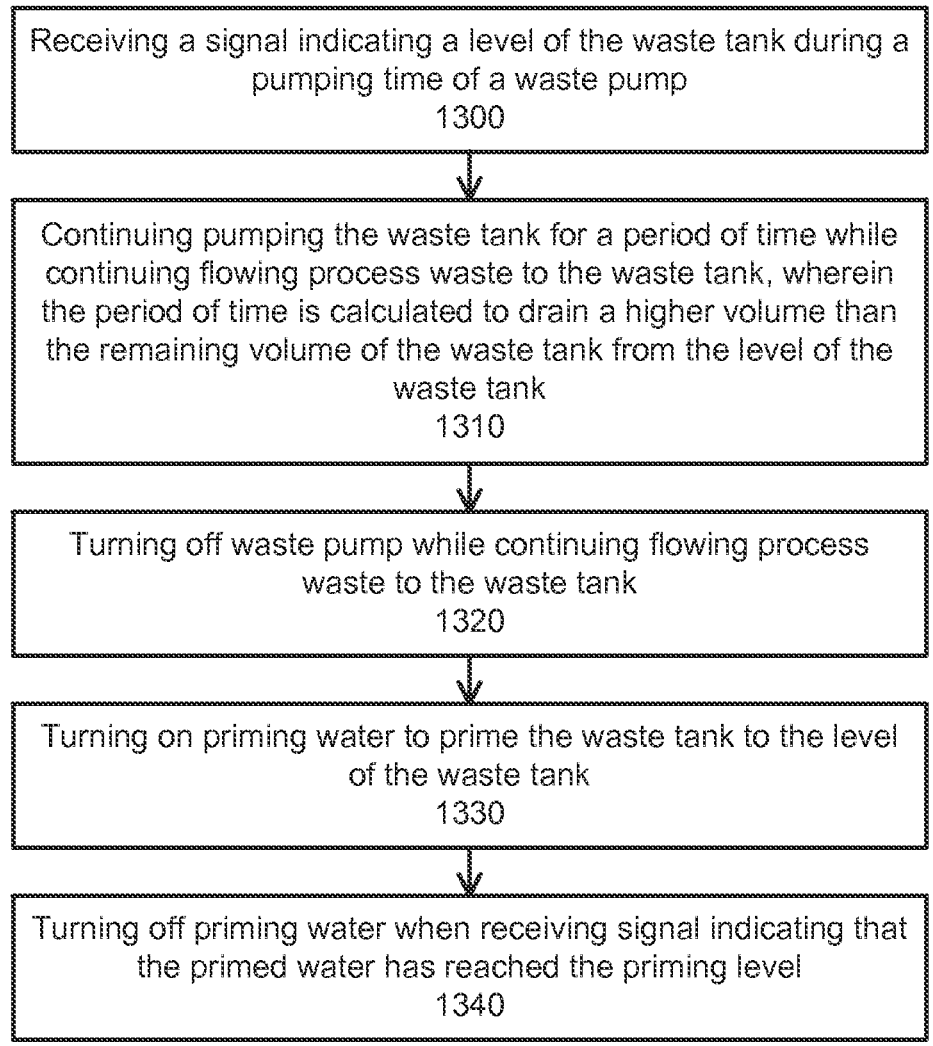
FIG. 13 illustrates another flow chart for enabling continuous processing according to some embodiments of the present invention.

FIG. 13 illustrates another flow chart for providing continuous processing according to some embodiments of the present invention. The flow chart describes an example of a liquid waste management, which allows a waste tank to operate, e.g., accepting waste flow from a process chamber, during the maintenance of the waste tank. In operation 1300, a signal is received indicating a level of waste in the waste tank while the process flow continues to run and the waste pump continues to run. The sensor can be installed to indicate a desired level of waste. Alternatively, other sensors can be used, such as the prime level sensor that is used for indicating a volume of water used for preparing the waste tank. In operation 1310, the waste pump continues to pump out the waste for a period of time while the process waste continues to flow to the waste tank. The period of time is calculated to drain a volume higher than the waste volume in the waste tank determined from the level of the waste tank. The time is preferably about 2-4 times longer than needed, for example, about 40 seconds for a 12 second volume. In operation 1320, the waste pump is turned off while the process waste continues to flow. As discussed above, a controller can be added to automate the process. In operation 1330, a water flow is turned on to prepare, e.g., prime, the waste tank. A high flow of water is preferred to reduce the hazard of reacting with any remaining chemicals in the waste tank. In operation 1340, the water is turned off after reaching a desired level, for example, as indicated by the prime level sensor.

In some embodiments, the conditions of the flow charts for priming a waste tank can be applied to the continuous process. For example, a waste full level sensor can be set at about 90 to 95% of the waste tank capacity. In some embodiments, the waste full level can be at least 60% or 80% of the waste tank capacity. The waste tank can be drained completely, meaning all liquid waste is removed from the waste tank. A portion of the solid waste in the waste tank can be removed during the drainage, and some portion of the solid waste can remain in the waste tank. The waste tank can be partially drained, leaving some liquid waste (and possibly some solid waste) within the waste tank.

In some embodiments, the present invention discloses a method of waste management, which can be used to manage multiple waste effluent streams from one or more substrate processing tools. A method involves providing one or more waste tanks configured to receive a waste effluent stream; receiving a first signal indicating a level of a waste tank of the one or more waste tanks; draining the waste tank by a waste pump; stopping the waste pump; and supplying a diluent flow to the waste tank to a volume in the waste tank. In some embodiments, the method further involves, before receiving the first signal, receiving a second signal indicating that the waste tank is full, wherein the volume of the waste tank determined by the second signal is less than the capacity of the waste tank; and starting the waste pump to drain the waste tank.

In some embodiments, the waste effluent stream continues to run while the waste pump drains the waste tank. The waste pump can be stopped after a time sufficient to drain the waste tank. The diluents can comprise deionized water. The flow rate of the diluents flow can be equal or higher than twice the flow rate of the waste effluent stream. The waste effluent stream can continue to run while the diluents flow is supplied to the waste tank. The volume can be equal to the level of the waste tank determined by the first sensor.

In some embodiments, the process continues to run while water is added to the waste tank with the waste pump still running. The water preferably flows to the waste tank at or near the end of the waste tank drainage. The water flow can be much higher than the process flow, for example, about 3 Lpm, to reduce or prevent any potential temperature rise. The water flow can be similar to the process flow, for example, about 1.5 Lpm, to still ensure >50% dilution of waste chemicals. The concurrent water flow and waste pumping can generate excess waste, but can prevent safety hazard because the waste chemicals in the waste tank always contains more than 50% water dilution. This process can preferably be used for chemicals that need dilution at some stages downstream of the waste stream.

In some embodiments, the present waste management can provide an effective removal of the waste chemicals, for example, to ensure that potential reactive chemicals are sufficiently removed from the waste tank. As an illustrated example, concentrated sulfuric acid is typically viscous and dense, tends to stay at the bottom of the waste tank and thus can be difficult to be pumped out. The presence of the remaining concentrated sulfuric acid can create potential thermal hazard when a water effluent waste stream entering the waste tank, heating the waste tank to a temperature above the tolerable temperature.

In some embodiments, at or near the end of the pumping cycle, the priming water can start flowing while the waste tank is still draining. The concurrent action of waste pumping and water priming can help in rinsing the waste tank, especially at the bottom of the waste tank to remove the viscous and dense chemicals. In this case, the pumping capacity is preferably higher than the priming water flow capacity for an effective rinsing. The viscous and dense waste at the bottom of the waste tank can be diluted with the priming water, allowing an effective and complete drainage of the waste tank.

The rinsing action can be time controlled, for example, for less than about 1 minutes or less than about 30 seconds, depending on the conditions of the waste management. For example, longer rinsing time can be accomplished with lower flow rate of priming water.

In some embodiments, a prime level sensor can be used to signaling the rinsing action. For example, when the waste level reaches the prime level, the priming water can start while the waste pump is still running. After a period of time, the waste pump stops, and the priming water continues to fill the waste tank to the prime level. The rinsing time is determined to ensure that the waste tank is clean, for example, a time corresponding to a pumped volume of about 3-6 times of the waste volume that is needed to be removed. In some embodiments, the rinsing time is less than about 1 minute, and preferably less than 45 seconds.

FIGS. 14A-14D illustrate another process flow for a continuous process according to some embodiments of the present invention. Using the prime level sensor 1440 that signal the volume of water to be added to the waste tank after a pump out, the waste volume 1450 of the waste tank can be determined.

In FIG. 14A, the waste 1450 reaches the prime level sensor 1440 after the waste pump 1420 drains the waste tank from the waste fill level. The process flow continues to run, continuously delivering the waste stream to the waste tank. The water inlet 1430 is closed. After the signal from the sensor 1440, the waste pump can continue running for a period of time to completely drain the remaining waste volume 1450. The time is preferably calculated to ensure a complete drainage, for example, by providing over-pumping time. In addition, the water inlet 1430 is open, adding water to the waste tank, diluting the waste 1452 (FIG. 14B). The water flow rate can be higher than the process flow to ensure at least 50% dilution of the waste 1452. The waste pump continues running during this time. The concurrent running of the waste pump and the water flow can provide a rinsing action on the waste tank, cleaning any heavy sludge remaining at the bottom of the waste tank. The rinsing action can generate excess waste, but can improve the safety level of the waste management system, since the chemicals in the waste tank is diluted, such as above 50% dilution.

In FIG. 14C, the waste is drained and the waste pump is turned off. The pumping time is preferably longer than needed, such as 40 second pumping for a 10 second volume. The pumping speed is preferably higher than the combined waste and priming flows to ensure adequate pumping. In some embodiments, the pumping time can shorter or longer, since the any remaining residue is generally diluted. After the water reaches the prime-level sensor 1440, the water flow 1430 is turned off (FIG. 14D).

Figure 15:
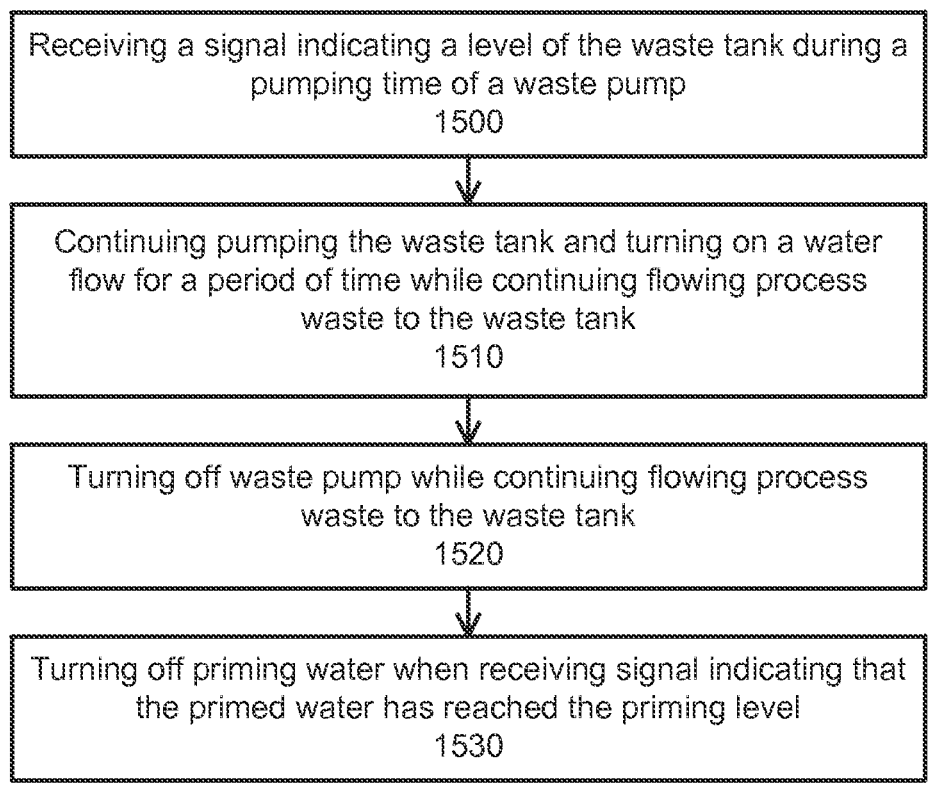
FIG. 15 illustrates another flow chart for enabling continuous processing according to some embodiments of the present invention.

FIG. 15 illustrates another flow chart for providing continuous processing according to some embodiments of the present invention. The flow chart describes an example of a liquid waste management, which allows a waste tank to operate, e.g., accepting waste flow from a process chamber, during the maintenance of the waste tank. In operation 1500, a signal is received indicating a level of waste in the waste tank while the process flow continues to run and during the waste pump continues to run. In operation 1510, the waste pump continues to pump out the waste for a period of time while the process waste continues to flow to the waste tank. In addition, the water flow is turned on to provide water to the waste tank, concurrently with the pumping action. In operation 1520, the waste pump is turned off while the process waste and the water flow continue to flow. As discussed above, a controller can be added to automate the process. In operation 1530, the water is turned off after reaching a desired level, for example, as indicated by the prime level sensor.

In some embodiments, the waste pump can continue for a period of time after being signaled by the prime level sensor before starting the rinsing action. For example, when the waste level reaches the prime level, the waste pump can continue for between about 30 to about 70% of the remaining waste before starting the priming water. In some embodiments, the waste pump can continue, for example, for less than about 30 seconds, or preferably about 15 sec, after the prime-level sensor turns off (i.e., signaling that the waste chemical is below the prime-level).

The rinsing action can be time controlled, for example, for less than about 30 seconds, preferably less than about 15 seconds. Since the rinsing time is shorter, the priming water flow can be higher (e.g., about 3 Lpm). The high flow priming water can be used for cleaning the bottom of the waste tank. Afterward, the pump is turned off, and the water flow continues until reaching the prime-level, for example, until the prime-level sensor turns on, signaling that the prime water has reached the desired priming level.

In some embodiments, the conditions of the flow charts for priming a waste tank can be applied to the continuous process. For example, a waste full level sensor can be set at about 90 to 95% of the waste tank capacity. In some embodiments, the waste full level can be at least 60% or 80% of the waste tank capacity. The waste tank can be drained completely, meaning all liquid waste is removed from the waste tank. A portion of the solid waste in the waste tank can be removed during the drainage, and some portion of the solid waste can remain in the waste tank. The waste tank can be partially drained, leaving some liquid waste (and possibly some solid waste) within the waste tank.

FIGS. 16A-16D illustrate another process flow for a continuous process according to some embodiments of the present invention. Using the prime level sensor 1640 that signal the volume of water to be added to the waste tank after a pump out, the waste 1650 of the waste tank can be determined.

In FIG. 16A, the waste 1650 reaches the prime level sensor 1640 after the waste pump 1620 drains the waste tank from the waste fill level. The process flow continues to run, continuously delivering the waste stream to the waste tank. The water inlet 1630 is closed. After the signal from the sensor 1640, the waste pump can continue running for a period of time to further drain some of the remaining waste volume 1650. The time can be set to reduce the remaining waste volume in the waste tank before the next rinsing action. For example, the volume can be set to about 10-50% of the remaining volume. Alternatively, a completely drain or an over-drain can be used. The time can be set to be between about 10 and 30 seconds, preferably about 15 seconds (FIG. 16B).

In FIG. 16C, high volume water flow from water inlet 1630 is provided to the waste tank while the waste pump 1620 continues to run. The high water flow can quickly dilute any remaining residues in the waste tank, forming a large volume of water to accept the added waste from the process flow. For example, the water flow can be about 3 Lpm. A rinsing action can be generated from the concurrent running of water and waste pumping. After rinsing, for example, for a predetermined time such as about 15 seconds, the waste pump is turned off. After the water reaches the prime-level sensor 1640, the water inlet 1630 is turned off (FIG. 16D).

Figure 17:
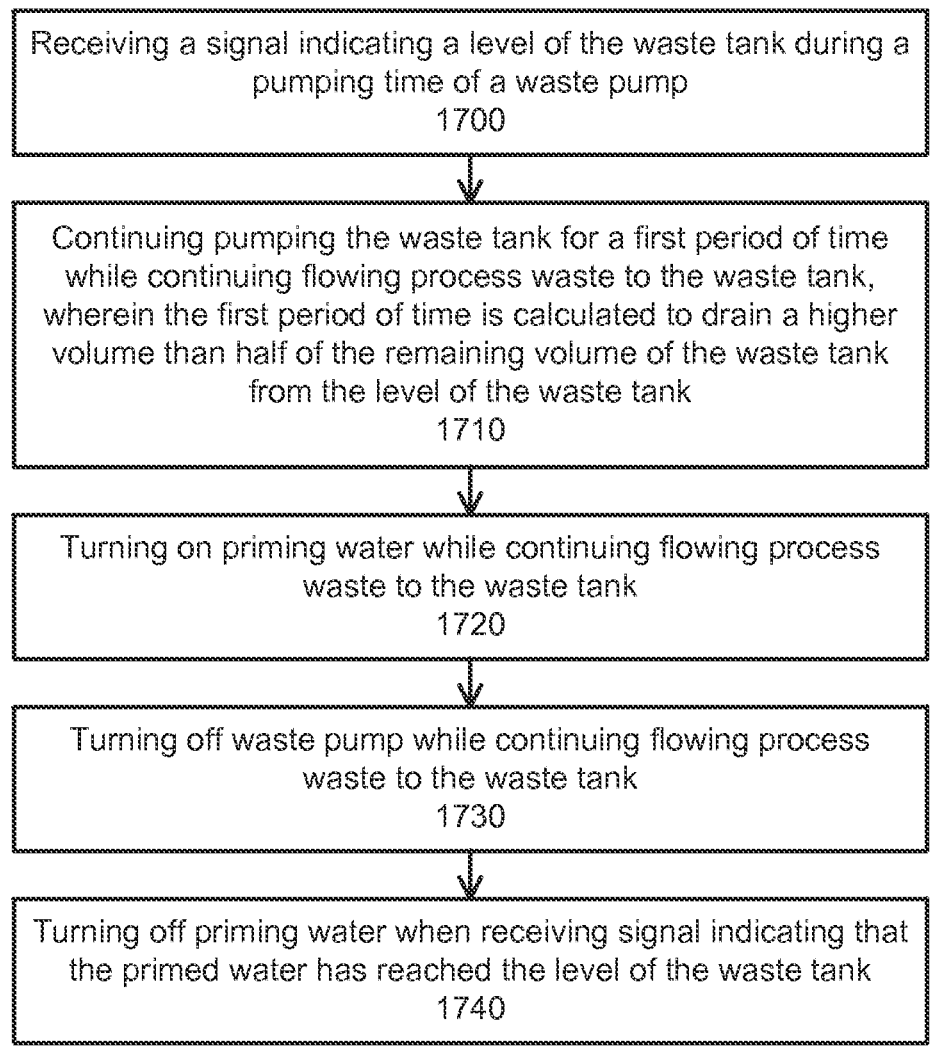
FIG. 17 illustrates another flow chart for enabling continuous processing according to some embodiments of the present invention.

FIG. 17 illustrates another flow chart for providing continuous processing according to some embodiments of the present invention. The flow chart describes an example of a liquid waste management, which allows a waste tank to operate, e.g., accepting waste flow from a process chamber, during the maintenance of the waste tank. In operation 1700, a signal is received indicating a level of waste in the waste tank while the process flow continues to run and during the waste pump continues to run. In operation 1710, the waste pump continues to pump out the waste for a period of time while the process waste continues to flow to the waste tank. The period of time is calculated to drain a volume higher than about half the waste volume in the waste tank determined from the level of the waste tank. The time is preferably about 1-2 times longer than needed, for example, about 15 seconds for a 12 second volume. In operation 1720, the water flow is turned on to provide water to the waste tank, concurrently with the pumping action. A high flow of water is preferred to reduce the hazard of reacting with any remaining chemicals in the waste tank. In operation 1730, the waste pump is turned off while the process waste continues to flow. As discussed above, a controller can be added to automate the process. In operation 1740, the water is turned off after reaching a desired level, for example, as indicated by the prime level sensor.

In some embodiments, the conditions of the flow charts for priming a waste tank can be applied to the continuous process. For example, a waste full level sensor can be set at about 90 to 95% of the waste tank capacity. In some embodiments, the waste full level can be at least 60% or 80% of the waste tank capacity. The waste tank can be drained completely, meaning all liquid waste is removed from the waste tank. A portion of the solid waste in the waste tank can be removed during the drainage, and some portion of the solid waste can remain in the waste tank. The waste tank can be partially drained, leaving some liquid waste (and possibly some solid waste) within the waste tank.

In some embodiments, the present invention discloses a method of waste management, which can be used to manage multiple waste effluent streams from one or more substrate processing tools. A method comprises providing one or more waste tanks configured to receive a waste effluent stream; receiving a first signal indicating a level of a waste tank of the one or more waste tanks; draining the waste tank by a waste pump; supplying a diluents flow to the waste tank after the waste pump is running for a first period of time; stopping the waste pump after the diluents flow is supplied for a second period of time; continuing the diluent flow to the waste tank to a volume in the waste tank. The period of time can be determined by a timer, or by a sensor. In some embodiments, the method further comprises, before receiving the first signal, receiving a second signal indicating that the waste tank is full, wherein the volume of the waste tank determined by the second signal is less than the capacity of the waste tank; and starting the waste pump to drain the waste tank.

In some embodiments, the waste effluent stream continues to run while the waste pump drains the waste tank. The first and second periods of time are each less than 30 seconds. The diluents can comprise deionized water. The flow rate of the diluents flow can be equal or higher than the flow rate of the waste effluent stream. The waste effluent stream can continue to run while the diluents flow is supplied to the waste tank. The volume can be equal to the level of the waste tank determined by the first sensor.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method of liquid waste management, the method comprising:
    providing a waste tank configured to receive a liquid waste;
    flowing the liquid waste to the waste tank from a process system;
    filling the waste tank to at least 60% of a waste tank capacity;
    draining the waste tank;
    after the draining, flowing a diluent to the waste tank, wherein a volume of the diluent in the waste tank is determined by a sensor, and wherein draining of the waste tank is determined by time after the sensor indicates the level of the liquid waste; and
    continuing flowing the liquid waste to the waste tank.

2. The method of claim 1, wherein the waste tank is filled to at least 80% of the capacity of the waste tank.

3. The method of claim 1, wherein the liquid waste comprises a concentrated acid and water.

4. The method of claim 1, wherein the diluent comprises deionized water.

5. The method of claim 1, wherein a flow rate of the diluent to the waste tank is equal or higher than twice a flow rate of the liquid waste to the waste tank.

6. The method of claim 1 further comprising
    continuously accepting a liquid waste flow to the waste tank during the draining and the diluent flowing.

\* \* \* \* \*